United States Patent [19]

Ciszewski et al.

[11] 4,220,886

[45] Sep. 2, 1980

[54] ELECTROACOUSTIC SANDWICH TRANSDUCER WITH BONDED JOINTS

[75] Inventors: Tadeusz Ciszewski; Tadeusz Gudra, both of Wrocław, Poland

[73] Assignee: Politechnika Wrocławska, Wroclaw, Poland

[21] Appl. No.: 940,153

[22] Filed: Sep. 5, 1978

Related U.S. Application Data

[63] Continuation of Ser. No. 805,162, Jun. 9, 1977, abandoned.

[30] Foreign Application Priority Data

Jun. 16, 1976 [PL] Poland .................................. 190511

[51] Int. Cl.[3] .............................................. H01L 41/08

[52] U.S. Cl. .................................................... 310/325

[58] Field of Search ........................ 310/322, 323, 325

[56] References Cited

U.S. PATENT DOCUMENTS 3,283,182 11/1966 Jones et al. .......................... 310/325

3,845,332 10/1974 Last ...................................... 310/325

FOREIGN PATENT DOCUMENTS 876357 7/1971 Canada .................................... 310/323

*Primary Examiner*—Mark O. Budd

*Attorney, Agent, or Firm*—Haseltine, Lake & Waters

[57] ABSTRACT

The transducer is formed of at least two metallic blocks (3) with at least one layer 3 of piezo-electric material sandwiched between these metallic blocks, the faces of the layer or layers being metal sprayed to conduct the voltage. One metallic block has at least one projecting element reaching to the opposite metallic block and being connected with the opposite block by means of a binder. Stresses are generated between the layers of piezo-electric material and the metallic blocks originate in the piezo-ceramic material. The faces of contact between the metallic blocks can be either slanted or perpendicular relative to the layers of piezo-electric material. The projecting elements can be made either as dowels or as collars. Oscillations in the transducer are excited by a voltage applied to the transducer terminals.

3 Claims, 3 Drawing Figures

ELECTROACOUSTIC SANDWICH TRANSDUCER WITH BONDED JOINTS

This is a continuation of application Ser. No. 805,162 filed June 9, 1977, now abandoned.

BACKGROUND OF THE INVENTION

Field of Art

This invention relates to an electroacoustic sandwich transducer serviceable in applications where the sound power of a high level is required. More particularly the transducer is effective for use in: ultrasonic washing equipment, emulsifiers or hydrolocation installations.

The construction of electroacoustic sandwich transducers is known from publications and practice. Usually one or more plates of piezo-ceramic material are fixed in between two loading frames which cause the mechanical resonance of depth oscillation of piezo-ceramic plate move towards lower frequencies. The loading frames, which usually are made as metallic blocks, are connected with piezo-ceramic plates by means of one or more threaded bolts forming bolted joints. Initial compressive stresses in piezo-ceramic material, required for proper operation of transducer are obtained by suitably balancing the torque of the bolts. The presence of these bolts affects the operation of transducer since the bolt heads or nuts cause undesirable resonances which are generated. These resonances lay beyond the basic resonance of depth oscillations of the loading frames. To mitigate this undesirable effect, the mechanical construction can in practice be modified by sinking the heads of bolts in counterbores made in one of the metallic blocks. A good solution is to reduce to a minimum the ratio between the mass of the bolt section projecting above the block and the mass of this block, however, this solution fails to eliminate the full occurence of harmful resonance.

In U.S. Pat. No. 3,183,378 titled "Sandwich Transducer" one of exemplary embodiments discloses, a transducer consisting of three metallic rectangular blocks with a centrally disposed hole to receive a clamping bolt screwed into the bottom metallic block and the head of this bolt is clamped to the top block. There are four piezo-ceramic material plates sandwiched between the top and center block, and four between the center and bottom block. These plates being cylindrical in shape and the faces of cylinder bases of these plates being metal sprayed. The plates are dimensioned in such a way that they, being located around the bolt and side by side one to the another, do not project beyond the outline of metallic blocks. The initial stress required for operation of the unit is obtained by clamping the whole assembly by means of a bolt. The alternating potential required to excite oscillations in the transducer is applied to the outer and center blocks. In another exemplary embodiment of the above mentioned patent, a transducer is disclosed wherein only two piezo-ceramic cylindrical plates with a central hole are sandwiched between three blocks, the surface of plates touching the blocks being smaller than the surface of blocks.

In U.S. Pat. No. 3,218,488 titled "Transducer", an electroacoustic sandwich transducer is disclosed consisting of two metallic blocks of different shape and of two or more layers of piezo-ceramic material sandwiched in between these blocks. The clamping bolt passes through a central hole made in blocks and layers, the head of this bolt being sunk to a certain depth in a counterbore made in one of the blocks, and the thread of the bolt being screwed into a hole tapped in the opposite block to a certain depth.

SUMMARY OF INVENTION

The present invention relates to an electroacoustic sandwich transducer consisting of metallic blocks with at least one layer of piezo-electric material sandwiched between the said metallic blocks, the supply potential being applied to the conductive faces of said layers, an electric insulating material being introduced between the blocks or in between the blocks and the layers of piezo-electric material. Fundamental to the present invention is the fact that at least one block includes at least one projecting element reaching to the opposite block, said element being connected with the later block by means of binding substance, and that stresses are generated between the layers of piezo-electric material and metallic blocks, said stresses originating in the said piezo-electric material. The contact faces between the blocks may be as required either slanted or perpendicular relative to the faces of contact between the layers of piezo-electric material and the blocks. In an alternative arrangement the projecting element of one of the blocks is made as a dowel received in the hole made in opposite block. In still another arrangement the projecting element is made as a collar either to receive the opposite block or to be received, at least at one flank, in the opposite block.

No tie elements are required in the present invention, e.g. no screws are required to produce an external load for operation of transducer. Such construction is possible since initial forces are obtained during assembly of metallic blocks of transducer; these forces being initiated by the bias voltage acting on the layers of piezo-electric material and by the initial loads. After the metallic blocks are assembled with piezo-electric layers the stresses are generated between these blocks and layers, said stresses being requisite for operation of transducer. In a transducer of such construction obtained in the above described manner, good acoustic coupling is obtained between the metallic blocks and piezo-electric layers, and harmful resonances initiated by the tie elements are eliminated. As a result no counterbores in the material of metallic blocks are required, such counterbores being requisite in conventional transducers to mitigate the harmful resonance, these transducers requiring also clamping screws of high tensile strength and having relatively small heads.

In the aforementioned way, the losses are reduced in the invented transducer and its efficiency is improved. There are mainly shearing forces acting on the binding substance in the transducer, the epoxy resin being, of all the known binding substances, most resistant to these forces. Depending on the configuration of the metallic blocks, the contact faces where the binding substance is applied can be made smaller or larger thus giving rise to control over the intensity of shearing forces and consequently the quality of joint. The fact that there are no tie elements used in the invented transducer enables its properties to remain constant while in service and there is no danger of retrogression due to a slack in the clamping bolt connection which may occur in conventional and known transducers.

The main object of the present invention is to overcome the defects of the prior art.

Another object of the invention is a transducer which is simplified and efficient and eliminates the tie-in elements.

Still another object is to employ a construction which includes a projecting element connected to an opposite block with a binder.

A further object is to provide a transducer with good acoustic coupling between the blocks and piezoelectric layers to eliminate harmful resonances.

Still other objects and advantages of the present invention will be better understood with respect to the accompanying specification, claims and drawings.

IN THE DRAWINGS

FIG. 1 diagramatically illustrates in longitudinal cross-section a version of the invention in which a dowel is used and how the bias voltage is applied.

PREFERRED EMBODIMENT OF INVENTION

Figure 1:
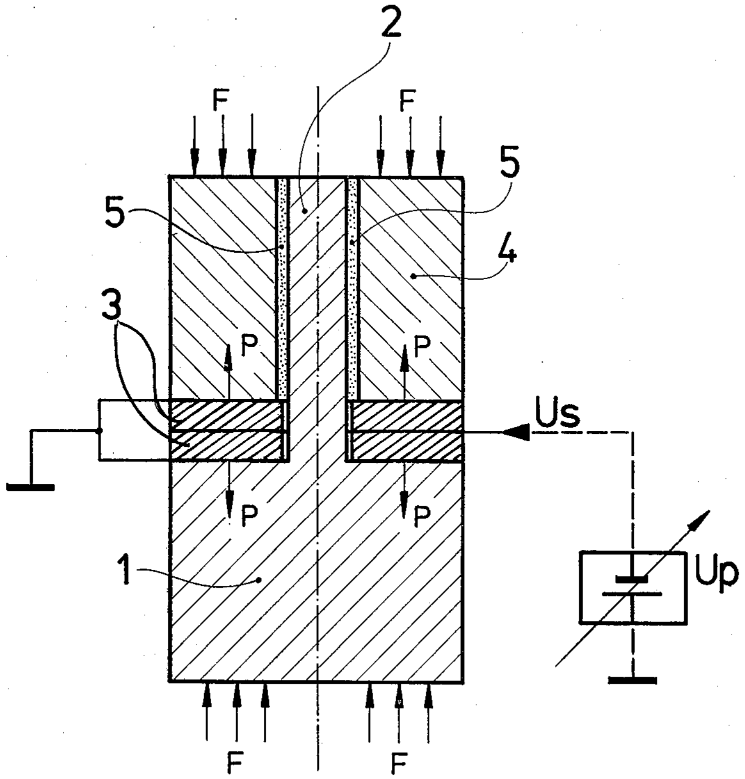

In the construction according to a first embodiment one block which serves as the radiant mass is a metallic cylinder 1 with a central cylindrical metal dowel 2, the dowel being perpendicular to the top face of cylinder 1 and constituting an integral element of the said cylinder (See FIG. 1). Centrally perforated discs 3 made of piezo-ceramic material are installed on the dowel 2 of cylinder 1, the faces of the discs being sprayed with metal, a metallic and centrally perforated cylinder 4 is installed on the discs 3, and serves as the loading mass. The face of hole in cylinder 4 is connected with the face of dowel of cylinder 2 by means of a layer of glue 5. A signal is applied during the transducer operation to the inter-adjoining metal sprayed faces of discs 3 made of piezo-ceramic material and forming one of electric terminals of transducer, the signal having the form of alternating voltage Us. The metal sprayed faces of discs 3 which are in contact with cylinder 1 and cylinder 4 are shorted thus forming the other electric terminal connected with the ground of the transducer. During the production process of the transducer, compressive forces F are applied to the metallic blocks, namely to cylinders 1 and 4, the forces being directed in perpendicular to the layers of piezo-ceramic material, namely perpendicular to discs 3. The bias voltage Up being simultaneously applied, in place of alternating voltage Us, to the electric terminals of transducer, the polarity of the bias voltage being reversed relative to that of the voltage of initial polarization of piezo-ceramic material used in production. The value of the bias voltage being not greater than the value of the voltage of initial polarization. Application of compressive forces F and of Up voltage of polarization is maintained during the process of introduction of glue 5 in between the dowel 2 and the hole in cylinder 4, and during the whole setting period of glue 5. After the glueing process is completed the compressive forces are removed and the Up voltage of polarization is disconnected. In a transducer made in accordance with the above described method the stresses P are produced. The stresses originate by the action of piezo-ceramic material upon the assembled and glued metallic blocks thus causing that in the transducer supplied with voltage Us oscillations to be excited as required, particularly oscillations of the resonance frequency of mechanical transducer.

ALTERNATE EMBODIMENTS

Figure 2:
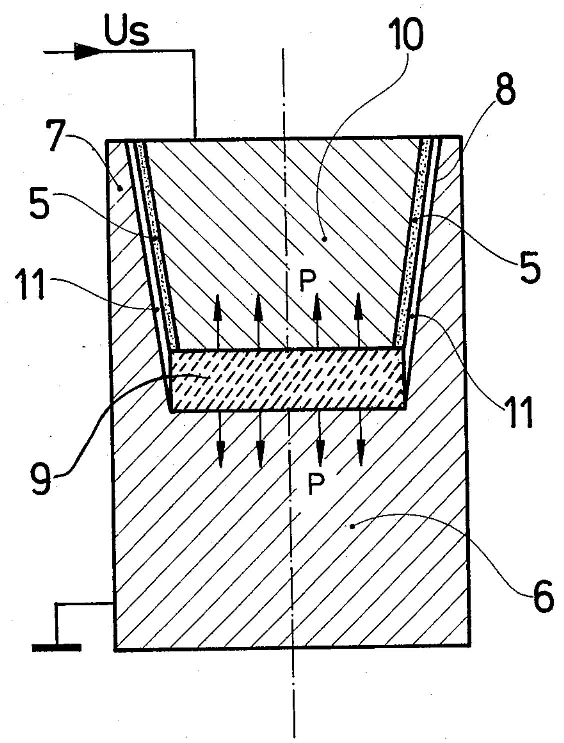
FIG. 2 illustrates in longitudinal cross-section a version of the invention in which the opposite block is received in the collar of the first block.

In accordance with FIG. 2 a second embodiment of the invention, an aluminium block is used, with the block playing the role of radiant mass and having the form of a hollow cylinder 6 with an outer collar 7, with the collar forming a conical recess 8. A disc 9 made of piezo-ceramic material with metal sprayed faces is installed in the bottom of recess 8. A second block, namely a steel block serves as the loading mass and is in the form of a truncated cone 10 and is installed inside the recess 8 in the hollow cylinder 6, with the block resting against disc 9.

The face of cone 10 is connected with the conical face of recess 8 by means of a layer of glue 5; the conical face of recess 8 being also coated with a layer 11 of electric insulation material. An alternating current Us is applied to the truncated cone 10 during transducer operation and the hollow cylinder 6 is connected with the ground. The production process and the properties of transducer are the same as of transducer described in the preferred embodiment.

Figure 3:
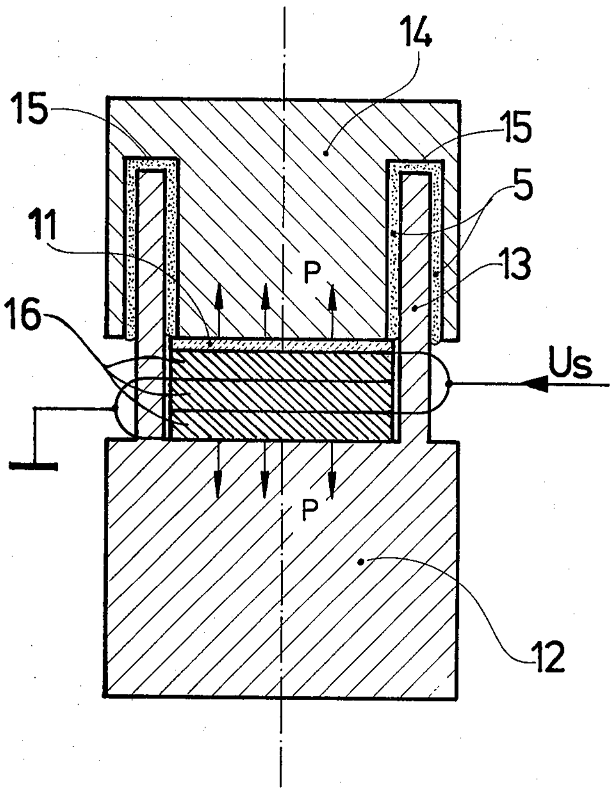
FIG. 3 illustrates in longitudinal cross-section a version in which the collar of one block is received at both flanks in the opposite block.

As shown in FIG. 3, still another embodiment has the metallic block serving as the radiant mass and is in the form of a cylinder 12 with an annular collar 13 situated at a specific distance from the flank of cylinder 12. Another metallic block playing the role of loading mass is made as a hollow cylinder 14 with an annular groove 15 whose dimensions and position are suited to the shape of annular collar 13 received in the hollow cylinder after all elements of transducer are put together in assembly. In the space inside the metallic cylinder 12, where the space is confined between the annular collar 13 and the lower face of hollow cylinder 14 with annular groove 15, are three solid discs 16 made of piezoelectric material with metal sprayed faces. These faces are alternately shorted and suitably connected to the alternating voltage Us and to the ground of transducer. A layer 11 of electric insulating material is applied between the bottom face of hollow cylinder 14, the extremity of the face being the groove 15, and the top face of adjoining disc 16. The face of groove 15 adjoining both sides of collar 13 are connected with the collar by means of a layer of glue 5. The production process and the properties of transducer are the same as of transducer described in the preferred embodiment.

Many modifications and variations of the present invention are possible in light of the above teachings. It is, therefore, to be understood that within the scope of the appended claims, the invention may be practiced otherwise than as particularly described.

What we claim is:

1. An improved electroacoustic sandwich transducer employing metallic blocks having at least one layer of piezo-electric material sandwiched between said blocks, said layer being provided with metal sprayed on said layer faces for conducting voltage supplied to the said face; an electric insulating material introduced between said blocks and said layers of piezo-electric material; a transducer defined by at least one block being provided with at least one projecting element, said projecting element adjoining an opposite metallic block and connected thereto by means of a binding substance whereby, stresses generated between the layers of piezo-electric material and metallic blocks originate in said piezo-electric material, said improvement comprising: said projecting element being concave and said opposite block having a cooperating concave element to allow contact between the respective elements at respective contact surfaces which are perpendicular to the surface of the piezo-electric layer, said piezo-electric material is between said blocks under compression and said binding substance being perpendicular to faces of said layers of piezo-electric material, thereby subjecting said layers to shearing forces formed in said piezo-electric material.

2. An improved electroacoustic sandwich transducer as claimed in claim 1 wherein: said binding substance being slanted to the layer faces of said piezo-electric material.

3. An improved electroacoustic sandwich transducer as claimed in claim 1 wherein: said respective contact surfaces are inclined to the surface of the piezo-electric layer.

* * * * *